United States Patent [19]

Tsang

[11] 3,936,813
[45] Feb. 3, 1976

[54] BIPOLAR MEMORY CELL EMPLOYING INVERTED TRANSISTORS AND PINCHED BASE RESISTORS

[75] Inventor: Frederick Tsang, Saratoga, Calif.
[73] Assignee: Intel Corporation, Santa Clara, Calif.
[22] Filed: Jan. 20, 1975
[21] Appl. No.: 542,346

Related U.S. Application Data
[63] Continuation of Ser. No. 354,252, April 25, 1973, abandoned.

[52] U.S. Cl.............. 340/173 FF; 307/291; 357/51
[51] Int. Cl.²........................................ G11C 11/40
[58] Field of Search.................. 340/173 FF; 357/51; 307/291

[56] References Cited
UNITED STATES PATENTS
3,655,999  4/1972  Wiedmann.................... 340/173 FF
3,693,057  9/1972  Wiedmann..................... 317/235 D OTHER PUBLICATIONS
Frantz et al., Monolithic Electric Circuit, IBM Technical Disclosure Bulletin, Vol. 14, No. 6, 11/71, p. 1684.
Haug et al., Single Emitter Pinch Resistor Cell, IBM Technical Disclosure Bulletin, Vol. 13, No. 2, 7/70, pp. 475–476.
Wiedmann, Random Access Memory Cell, IBM Technical Disclosure Bulletin, Vol. 14, No. 6, 11/71, pp. 1721–1722.
Wiedmann et al., Small-Size Low-Power Bipolar Memory Cell, IEEE Journal of Solid-State Circuits, Vol. SC-6, No. 5, 10/71, pp. 283–288.

Primary Examiner—Stuart N. Hecker
Attorney, Agent, or Firm—Spensley, Horn & Lubitz

[57] ABSTRACT

A bipolar random access memory cell is disclosed using a pair of transistors cross-coupled in a flip flop configuration with the transistors connected to operate in the inverted mode, that is, the collectors as emitters and the emitters as collectors. This allows an integrated circuit realization of a random access memory having only one and one-half isolation regions per row of memory cells. Forming the flip flop load resistors by the emitter-pinched base method compensates the cell for process variations to result in substantially constant read/write characteristics.

11 Claims, 5 Drawing Figures

BIPOLAR MEMORY CELL EMPLOYING INVERTED TRANSISTORS AND PINCHED BASE RESISTORS

This is a continuation of application Ser. No. 354,252, filed Apr. 25, 1973 now abandoned.

BACKGROUND OF THE INVENTION

1. Field of the Invention

This invention relates to the field of bipolar random access memories.

2. Prior Art

The prior art contains a number of bipolar random access memory cells varying in complexity and desirability. These cells usually consist of a pair of cross coupled transistors with load resistors in the collector circuits to form a flip flop, means for sensing the state of the flip flop, and means for writing in a desired state.

A useful memory unit contains an array of cells arranged in rows and columns, each cell in a row being connected by one or more "word lines" and each cell in a column being connected by "bit lines", usually two in number. The bit lines are coupled to the individual cell flip flops through diodes or other devices which decouple the cells from the bit lines except during the time that that particular row of cells is being interrogated. The decoupling means can either be separate devices or integral with the flip flop transistors, as for example, an additional emitter element.

As a minimum, then, prior art memory cells of the class being discussed comprise four distinct elements: a pair of transistors and two load resistors associated with the transistors. When such cell arrays are manufactured using conventional integrated circuit techniques, it is necessary that the individual circuit elements be electrically isolated in order that proper operation be achieved. The required isolation in the form of isolation barriers diffused through an epitaxial layer to a buried layer is space consuming, so that a practical memory cell occupies considerably more space than that taken by the individual devices. By using a reverse connection to the flip flop transistors, that is, by using what is normally considered to be the collector as an emitter, and vice versa, an arrangement is achieved which reduces drastically the isolation requirements of the cell and permits the cell area to be about one third of that required by the prior art.

The state of any particular cell of a memory array may be sensed by drawing current from the bit lines associated with the cell and comparing the relative levels existing on those lines to determine which of the transistors in the flip flop is in the conductive state. The amount of current which can be drawn without danger of causing the flip flop to change states is a function of, among other things, the gain of the transistors, and the value of the load resistors. Normal fabrication processes are such that those factors vary substantially from cell to cell within a unit, and also from unit to unit, with the result that the current drawn during sensing must be severly limited lest a marginal cell be inadvertently actuated during a read cycle.

Conversely, since the current required to write into a cell varies, sufficient write current must be provided to assure that the least sensitive cell changes state when desired.

Thus in prior art cells, for adequate reliability, substantially less than nominal sense current is available for sensing the cell state, and substantially more than nominal write current must be provided for writing information into the cell.

Due to the unique self compensating nature of the invented cell, the read and write currents are much more uniform so that a large margin of safety is not required, resulting in lower power requirements, higher yield, and greater reliability.

Thus, it is an object of the present invention to provide a memory cell for use in a bipolar random access memory of small size enabling the fabrication of an array of a large number of cells on one chip.

It is also an object of the present invention to provide such a cell having characteristics which are insensitive to normal process variations.

A further object of the present invention is the production of a memory cell having low power requirements.

These and many other objects and advantages of the invented memory cell and resulting memory matrix will become apparent from the detailed description of the invention to follow.

SUMMARY OF THE INVENTION

The invented cell is a bipolar random access memory comprising a pair of transistors cross coupled to form a flip flop, with the preferred embodiment having a second pair of transistors operated as emitter followers connected between the flip flop outputs and the bit lines of the memory array. While the cell can be assembled from standard discrete components, the major advantages to be gained are best realized when the cell is fabricated as part of an integrated circuit memory array.

The flip flop transistors are inverted, that is, the elements normally conceived of as collectors are used as emitters and vice versa. This connection allows all of the flip flop transistors along one word row to be fabricated within a single isolation zone of the integrated circuit array.

All emitter follower transistors have their collectors connected to the supply voltage. The flip flop load resistors are also connected to the supply. These components are realizable without isolation between the elements, since conventional integrated circuit fabrication results in transistors with a common collector connection. By laying out adjacent rows in an inverted manner, all emitter followers and load resistors for two rows of memory cells can be contained in a single isolation zone. Effectively, then, the invented cell requires only 1½ isolation zones per row of cells, as compared to several isolation zones per cell for prior art memories.

In standard integrated circuit fabrication, the beta of transistors is subject to variation because of unavoidable variation in the process. This leads to a variation in the amount of current drain which will cause the flip flop to change state. Prior art memory cell arrays must be operated such that the state sensing means draws less current than that which will cause the most sensitive cell to change state. Since the variation in sensitivity of prior art cells is substantial, the sensing current must be held to a much smaller value than would be desirable. At the same time, write current must be high enough to switch the least sensitive cell.

Adding to the variation in read/write characteristics of prior art memory cells is the fact that for space economy, the load resistors are typically epitaxially grown, and the difficulties in controlling the thickness and doping of the layers makes it impractical to obtain consistent values. Overall variation in toggle current characteristics of prior art cells is often of the order of a factor of 2 or 3.

In the invented cell, the load resistors are made by the pinched base process which are also subject to large variations but these resistors are sensitive to the same process variables as the beta of the flip flop transistors. The result is that the variation of resistance of the load resistors very nearly compensates for the variation in beta of the associated flip flop transistors. For this reason, the current required to change the state of a cell of the invented variety is substantially constant for any particular nominal process, the variation being only a few percent without exceptional care.

DETAILED DESCRIPTION OF THE INVENTION

Figure 1:
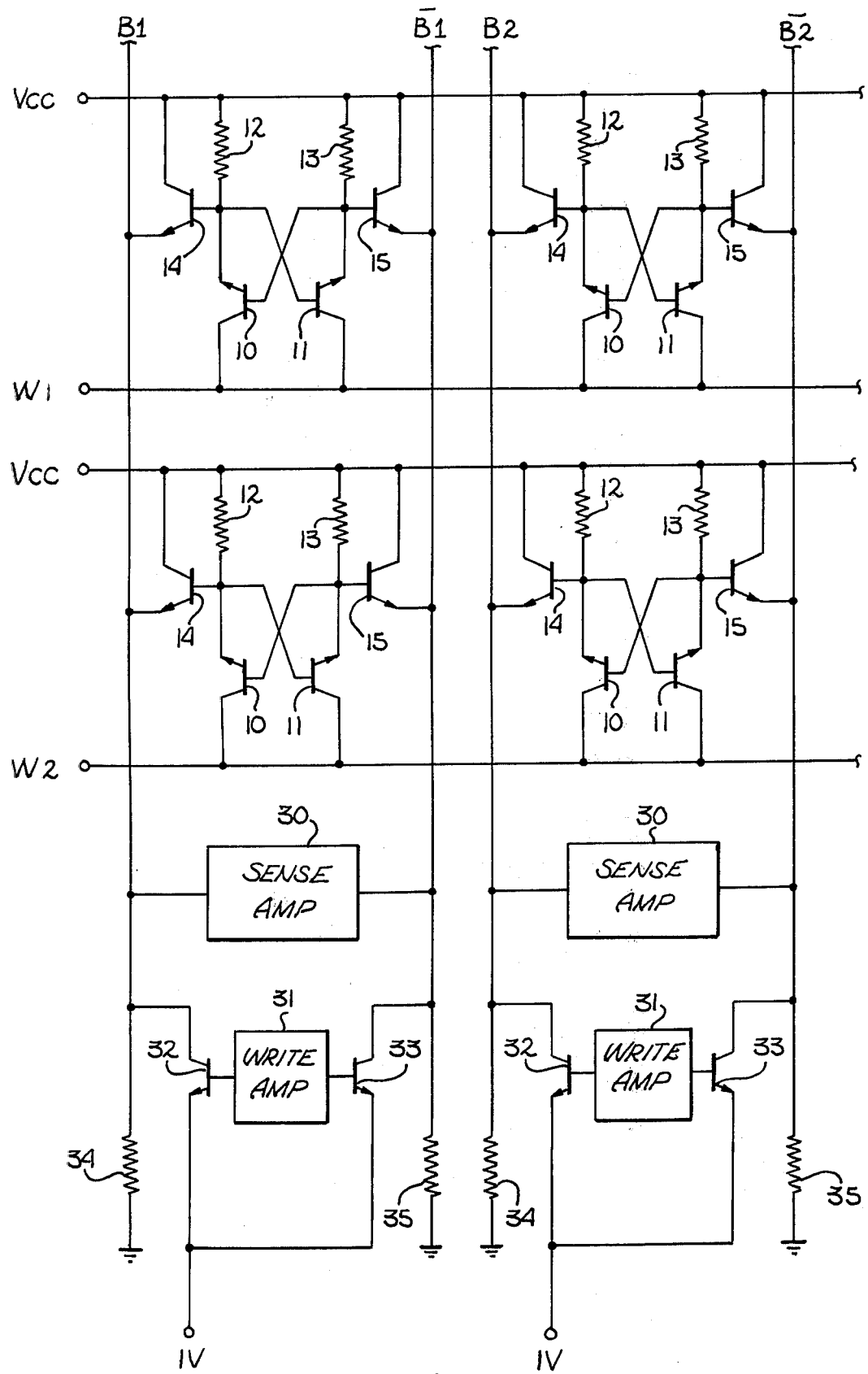
FIG. 1 is a schematic diagram of a 2×2 array of memory cells.

Referring first to FIG. 1, four of the invented memory cells are schematically shown connected as a 2×2 array. It is well known that such arrays can be constructed of any number of cells, the limitation being the size of the semiconductor chip available relative to the individual cell size. The small cell size of the invented cell (of the order of 10 square mils versus in the order of 30 square mils for prior art cells) makes practical arrays as large as 1024 bits or larger on a single chip. Larger arrays can be achieved by interconnection between separate chips.

Transistors 10 and 11 are cross connected to form a standard flip flop circuit including load resistors 12 and 13. Such connection is common in the art, except that in the invented cell transistors 10 and 11 are inverted, that is, the element usually considered as the collector is connected as an emitter and the element usually considered as the emitter is connected as a collector. Though a transistor is a bilateral device, transistors fabricated by integrated circuit techniques which might have a beta of 20 in the forward dierection might have a beta of about 1 in the reverse direction. This degradation in characteristics has discouraged prior workers from seriously considering using such a connection. The reasons why, despite the poor performance available, that the connection is advantageous in the present invention will become evident when the physical realization of the circuit on an integrated circuit chip is discussed. In the explanation that follows, the element of a transistor commonly called a collector is called a collector irrespective of whether, in the particular circuit, it acts as an emitter. The same convention is used for the element which is commonly called an emitter. This in normal integrated circuit fabrication, an area of the substrate constitutes the collector with a smaller base region diffused into that region, and a still smaller emitter region diffused into the base region.

Transistors 14 and 15, connected as emitter followers, complete the cell circuitry of the preferred embodiment. While other coupling devices and/or methods may be employed to couple the flip flops to the bit lines, such as, by way of example, diode coupling, the current gain provided by transistors provides a relatively large read current capability. (An additional emitter on the transistors 10 and 11 could also be used for coupling by way of further example.) Available current will vary with the particular design normally being in the range of 1 to 20 ma, and typically being about 5 ma. The variation between cells on a single chip and from chip to chip nominally processed in the same manner is, as will be presently explained, very small.

As indicated in FIG. 1, the individual cells are arranged in rows and columns with the collectors (acting as emitters) of all flip flop transistors in a single row being connected and designated the word line for that row. Thus a series of word lines, W1, W2, etc., associated with rows 1, 2, etc., are created and are used in selecting particular cells to be read or written into.

The emitters of the corresponding emitter followers in each column of cells are connected and designated bit lines, there being two bit lines for each cell. The bit lines are designated B1 and $\overline{B1}$, B2 and $\overline{B2}$, etc., corresponding to column 1, 2, etc.

Typical peripheral circuity, which is well known in the art, is shown in a simplified configuration in FIG. 1 and includes sense amplifier 30, write amplifier 32 and write transistors 32 and 33 for column 1. This equipment typically is duplicated in each column. The sense amplifiers, write amplifiers, decoders, coders, etc. may be of any of the designs as are well known in the art and need not be described here.

In the following description of the operation of the invented memory cell assume that the array of FIG. 1 is connected to a computer system and Vcc is the normal computer power line of 5 volts. The word lines W1, W2, etc., are maintained at a low voltage of say 1 volt and the individual memory cells are in whatever states represent the information stored in the memory array.

If the computer algorithm requires that the memory cell in row 1, column 1, be interrogated to determine which of its two possible states exists as of that moment, the voltage on the word line for row 1, W1, is raised to some higher voltage, say 3 volts, and the output of sense amplifier 30 is observed. If transistor 10 is on and transistor 11 is off, the base of transistor 10 will be at about 3.7 volts, assuming a base-emitter saturation voltage of about 0.7 volts. The base of transistor 15, being connected to the base of transistor 10 is also at 3.7 volts. Since resistor 35 presents a path to ground, the emitter base diode of transistor 15 is forward biased and bit line $\overline{B1}$ will be at 3 volts.

There is little voltage drop across transistor 10 in its conductive state so that the base of transistor 14 will be at about the voltage of W1 or 3 volts. The emitter base diode of transistor 14 is also forward biased due to resistor 34 and therefore bit line B1 will be at about 2.3 volts.

The voltages just derived for the bit lines B1 and $\overline{B1}$ will exist on the lines, unless the voltages are affected by one of the other cells in the same column (which are connected to the same bit lines). It can be easily seen that such effect will not in fact exist, since all word lines, with the exception of W1, are at 1 volt, resulting in base voltages of the emitter follower transistors in these rows of 1.0, and 1.7 volts in each cell. The base emitter diodes of these transistors are seen to be reverse biased and thereby will have no effect on the bit line voltages.

The 0.7 volt difference between B1 and $\overline{B1}$ is detected by the sense amplifier and may be processed therefrom in a conventional manner. Typically the output of one sense amplifier will be selected, as a result of a column address decoding, for further processing. If transistor 11 had been on instead of transistor 10, the 0.7 volt differential between B1 and $\overline{B1}$ would have been of the opposite polarity, which would be appropriately sensed by the sense amplifier.

The condition of any cell in the array can be determined by raising the voltage on the word line containing the cell to be interrogated and sensing the polarity on the bit lines in the column of the cell.

If it is desired that in the cell of row 1, column 1, transistor 11 be turned on to represent a bit of information stored in the memory, the voltage in W1 is raised to 3 volts just as was done when interrogating the cell, but instead of sensing the voltage on the bit lines, B1 is connected to the same low voltage appearing on the unselected word lines as by turning transistor 33 on with write amplifier 31. This will cause the bases of transistors 15 and 10 to drop resulting in a positive pulse being fed back to transistor 11. Transistor 10 will thus cut off and transistor 11 go into conduction. Cells in other rows are unaffected since the emitter-base diodes of the emitter followers in these cells will never become forward biased so as to be able to conduct a pulse to the flip flop transistors.

Figure 2:
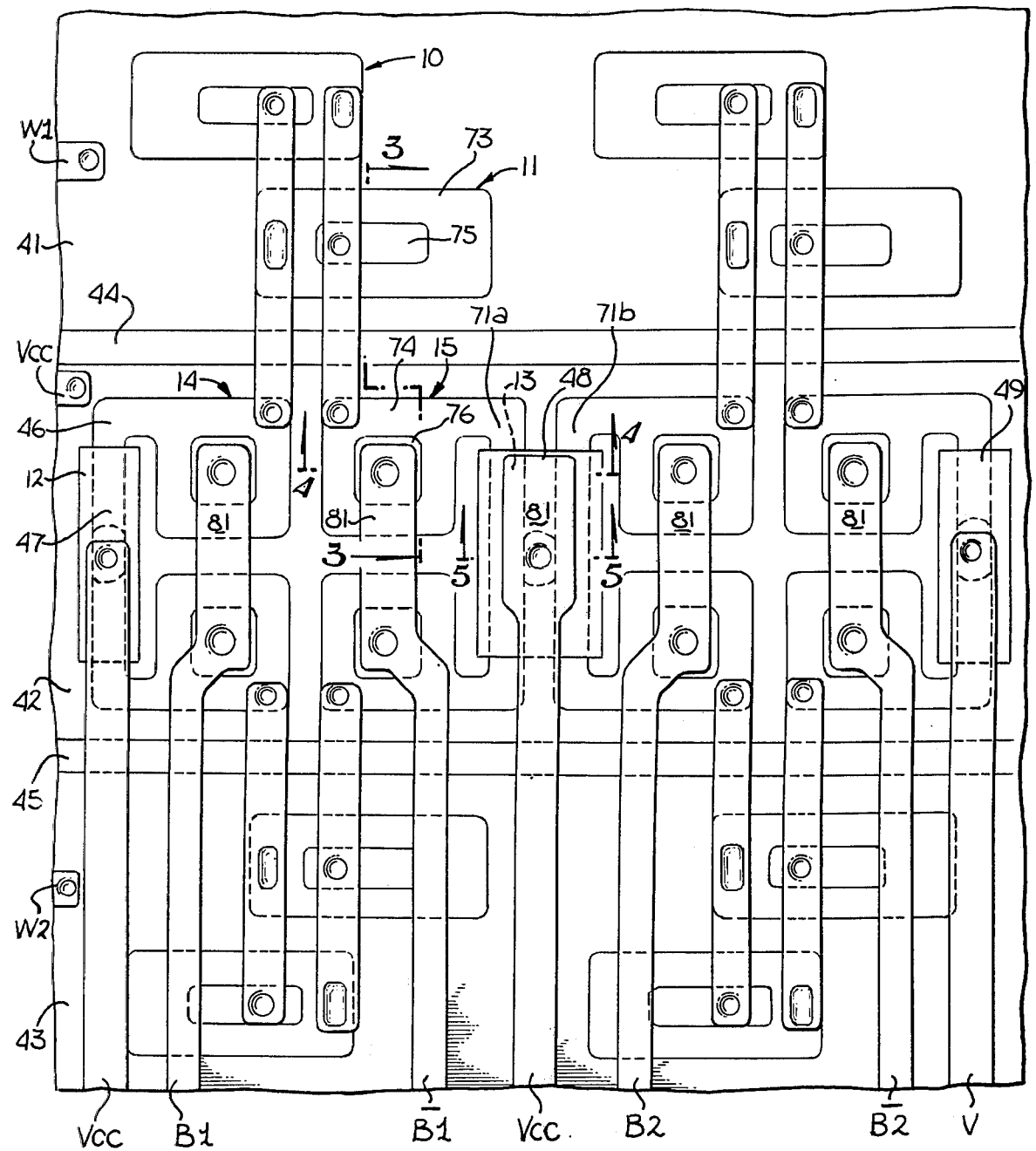
FIG. 2 is a plan view of an integrated circuit realization of the 2×2 array of FIG. 1, illustrating the manner in which adjacent cells are arranged in large memory matrices.
Figure 3:
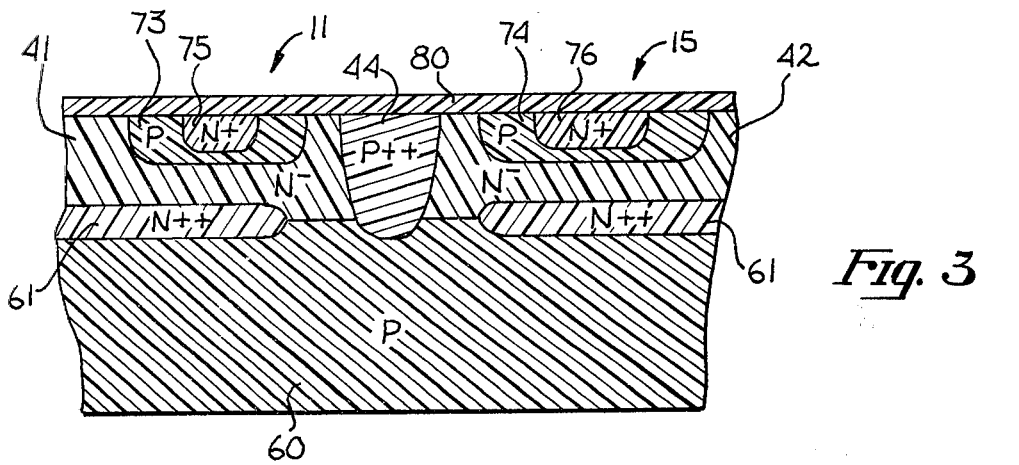
FIG. 3 is a cross-section taken along lines 3—3 of FIG. 2.
Figure 4:
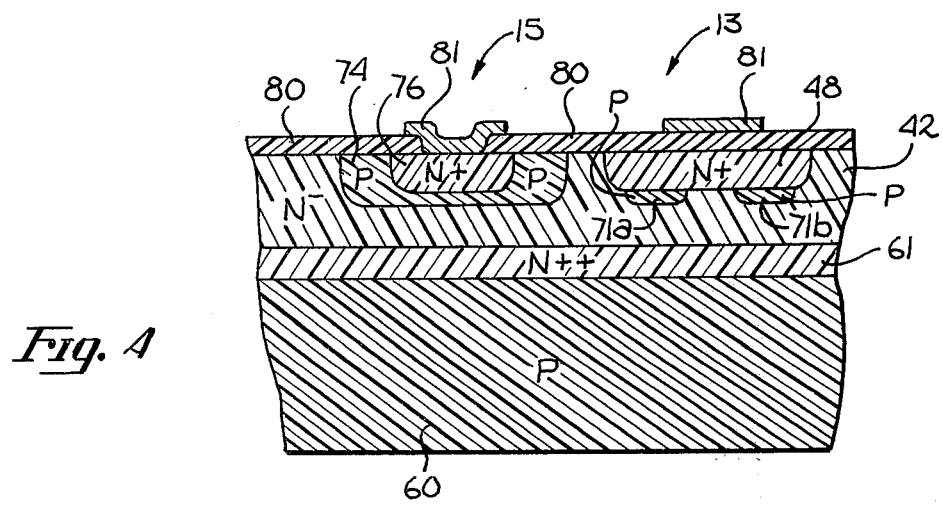
FIG. 4 is a cross-section taken along lines 4—4 of FIG. 2.
Figure 5:
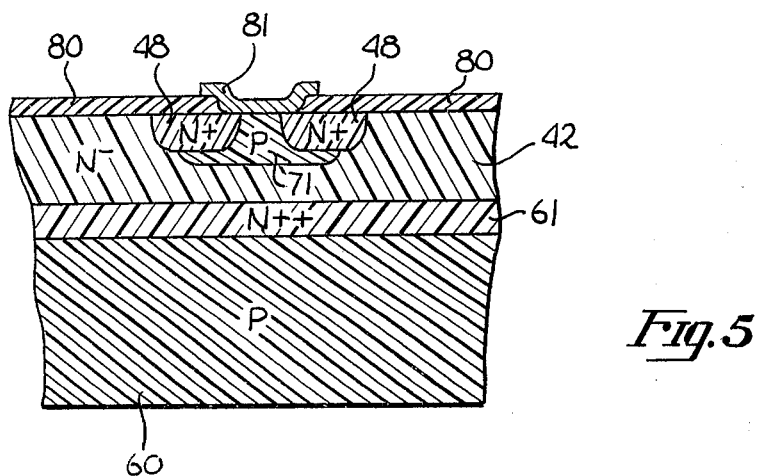
FIG. 5 is a cross-section taken along lines 5—5 of FIG. 2.

A plan view of a simple memory cell array utilizing the invented memory cell is illustrated in FIG. 2, and typical cross-sections of the cell are shown in FIGS. 3, 4 and 5. (The cross-section of FIG. 3 is taken just to the side of the adjacent metalization layer coupling the two transistors.) The circuit is realized in the embodiment illustrated utilizing NPN transistors formed on a p-type semiconductor substrate. It will be evident to those skilled in the art, however, that the circuit could also be realized in other ways, such as, by way of example, by using PNP transistors on an n-type substrate or even using other than integrated circuit technology. The advantages of the invented circuit can, however, be appreciated with reference to the presently preferred embodiment.

An array of four cells arranged in a 2×2 square pattern is illustrated, but an array of any size is possible by a simple extension of the scheme illustrated.

The 2×2 array of FIG. 2 is seen to have three electrically isolated regions, 41, 42, and 43, separated by isolation layers 44 and 45. Fabrication can be effected in accordance with conventional integrated circuit techniques. As shown, a P-type substrate 60 is provided with an epitaxial region thereover forming regions 41, 42 and 43. N++ buried layers 61 increase the apparent conductance of the adjacent region, with p++ isolation barriers 44 and 45 extending to the substrate to electrically isolate the two adjacent regions. Isolated region 41 contains the flip flop transistors of the memory cells in row 1, isolated region 43 contains the flip flop transistors of the cells in row 2 and isolated region 42 contains the emitter follower transistors for both rows 1 and 2. For larger arrays the pattern is repeated, that is, an isolated region for the flip flop transistors for one row of memory cells is formed on each side of an isolated region containing the emitter follower transistors for two rows of flip flop transistors.

The transistors and load resistors in the memory cell of row 1, column 1, are numbered in the same manner as in FIG. 1 for ease in reference.

The fabrication of the transistors on the integrated circuit chip shown in FIG. 2 may proceed in accordance with conventional integrated circuit techniques which are well known and need not be described in detail. As is well known, the geometry of transistors laid down on an integrated circuit chip leads to the formation of devices having a common collector connection, unless isolation zones are provided on the chip for the purpose of isolating the individual collector. Prior art memory cells, not utilizing a common collector configuration, may involve the use of multiple isolation zones in order to achieve the necessary circuit. Isolation zones are space consuming and thus by utilizing circuity in which the collectors of many of the devices used are intentionally connected, large savings in space are achieved.

In the invented cell all flip flop transistors in a single row and all emitter follower transistors have such a common collector. This leads to the possibility of reducing the number of isolated regions on the semiconductor chip to the number of rows in the memory matrix plus one. Such a layout, while possible, would result in excessive wiring between components. The illustrated topology is a reasonable compromise between economy of isolation and economy of inter-connection. By making each isolation region containing emitter follower transistors serve two rows, the number of isolation regions required for an array is seen to be one and one-half regions per row as compared to several per call in the prior art. The memory cell load resistors (e.g., resistors 12 and 13 in the cell of row 1, column 1) are preferably of the "pinched base" variety, which has previously been known. These resistors are made in the preferred embodiment illustrated by creating extensions to the bases of the emitter follower transistors, for example, extension 46 to the base of transistor 14. The extension is relatively long and thin so that it is in effect a resistor without further processing. However, base material typically has a resistivity of the order of 120 ohms per square, much lower than the resistivity desired to form a proper load resistor within the small space allotted. The resistivity of the material is increased drastically by diffusing n+ type semiconductor material partially into the base extension at the same time as the n+ diffusion for the transistor emitters is made. The area over which this diffusion is effected can be seen as areas 47, 48 and 49 (for resistor 12, the load resistor associated with transistor 10).

The resistivity of the material in the base extensions such as extension 46 is thereby increased to perhaps 15K ohm to 50K ohm per square. A three to one variation in the resistance of the resistors so obtained can be expected because of inadvertent process variations, primarily due to the level of impurity introduced into the pinched base region as well as the width of the base region. To a first order approximation, the resistance of the pinched base resistors is inversely proportional to the impurity introduced. As is well known, the beta of a transistor is also inversely proportional to the impurity introduced into its base region by the emitter diffusion. Since the memory cell transistors are physically close to the load resistors and their respective characteristics, at least to the first order approximation, vary in the same way, the ratio of resistance of the resistors to the beta of the flip flop transistors in any cell is substantially constant for a particular nominal process.

The foregoing described structure is illustrated in FIGS. 3, 4 and 5, and particularly in the last two of these figures. The P-regions forming the bases for transistors 11 and 15 and also forming the base extensions, such as extension 71a of transistor 15 and the extension 71b of the adjacent transistor (not numbered in FIG. 2), are diffused into the substrate as P-regions 73, 74 and 71 (71a and 71b being integral parts of the region 71). Thereafter the emitter regions 75 of transistor 11, and 76 of transistor 15, as well as the n+ areas 47, 48 and 49 forming the pinched-base resistors are diffused. Thus, it is apparent that the depth of the resistors will be substantially the same as the depth of the base regions of the transistors and that the depth of the regions 47, 48 and 49 will be substantially equal to the depth of the emitters of the transistor. Thus, the impurity introduced into the pinched-base resistors (e.g. regions 71a and 71b, for example), while varying with the processing, will be the same in any memory chip as in the base regions of the transistors so that the resistance of the pinch-base resistors will track the beta of the transistors quite accurately, independent of the processing. (Final processing includes the providing of an oxide layer 80 with selected window areas therein, and a patterned metalization layer 81 forming the various interconnections such as lines B1, $\overline{B1}$, Vcc, etc.

As previously described, writing into the invented memory cell involves drawing current from one of the bit lines. The amount of current necessary to toggle the flip flop is determined by the combination of the resistance of the load resistors and the beta of the flip flop transistors. The higher the resistance of the resistors, the less base drive is available to switch the flip flop, but the higher the beta of the flip flop transistors the less base drive is necessary to switch. Thus, the minimum writing current required remains relatively constant, despite large changes in the components because of process variations. (The minimum writing current also represents, in theory, the maximum read current, as any reading current below that level is satisfactory but any attempted read current above that level acts as a write current by overriding the state of the flip flop to drive it to the opposite state.) As a practical matter, the writing current requirement can be held to a variation of just a few percent, which, as previously discussed, eliminates the need for large margins of safety in either the read and write current.

What has been described is a novel bipolar random access memory in a preferred embodiment. Modifications in form, design and arrangement from that described will be obvious to those skilled in the art, all of which are within the spirit and scope of the invention.

I claim:

1. A bipolar memory cell which comprises:
a. a first pair of transistors, said transistors having their collectors coupled and each having its base coupled to the emitter of the other of said transistors, said first pair of transistors being formed on a single semiconductor chip, the collectors of said first pair of transistors being portions of a contiguous semiconductor region on said semiconductor chip, said contiguous semiconductor region further having first pairs of transistors of additional memory cells;

b. a second pair of transistors, said second pair of transistors being formed on a second contiguous semiconductor region on said single semiconductor chip, the collectors of said second pair of transistors being portions of said second contiguous semiconductor region, the bases of said second pair of transistors each being coupled to one of the emitters of said first pair of transistors respectively, said second contiguous semiconductor region further having second pairs of transistors of additional memory cells;

c. a pair of pinched base resistors, formed on said second contiguous semiconductor region, each having one end coupled to the emitter of one of said first pair of transistors, and the other ends coupled together, and;

d. coupling means for coupling said emitter of each of said second pair of transistors to an external circuit.

2. A bipolar memory cell as in claim 1 wherein said pair of resistors are portions of the base elements of said second pair of transistors, said portions having their resistivity raised by diffusion of impurities corresponding to the opposite conductivity type semiconductor material to said base element into said portions of said base element.

3. A bipolar memory cell as in claim 2 wherein said pairs of transistors are of the NPN type.

4. A bipolar memory cell comprising:
a semiconductor having at least first and second isolated regions of a first conductivity type;
first and second transistors formed in said first region, said first and second transistors each having an emitter and a base, and having a common collector formed by said first region;
third and fourth transistors formed in said second region, said third and fourth transistors each having an emitter and a base, and having a common collector formed by said second region;
first and second pinched base resistors formed by extensions of the base regions of said third and fourth transistors, said extensions having a region of said first conductivity type diffused thereover;
means for coupling said emitter of said first transistor to said base of said second transistor and said base of said third transistor; and
means for coupling said base of said first transistor to said emitter of said second transistor and said base of said fourth transistor.

5. The cell of claim 4 wherein first and second transistors for additional memory cells are formed in said first region, and third and fourth transistors and first and second pinched base resistors for additional memory cells are formed in said second region.

6. The cell of claim 4 further comprised of means for coupling to said first region.

7. The memory cell of claim 6 wherein first and second transistors for additional memory cells are formed in said first region.

8. The cell of claim 4 further comprised of means for coupling to said first and second pinched base resistors and means for coupling to said emitters of said third and fourth transistors.

9. The cell of claim 8 wherein third and fourth transistors and first and second pinched base resistors for additional cells are formed in said second region.

10. A memory cell comprising:

first and second transistors formed in a first region of a first conductivity type, each having an emitter and a base, and having common collectors formed by said first region;

third and fourth transistors formed in a second region of a first conductivity type, said third and fourth transistors each having an emitter and a base and having a common collector formed by said second region;

first and second resistors formed by extensions of the base regions of said third and fourth transistors;

means for coupling said emitter of said first transistor to said base of said second transistor and said base of said third transistor; and means for coupling said base of said first transistor to said emitter of said second transistor and said base of said fourth transistor.

11. The memory cell of claim 10 wherein said resistors have a region of said first conductivity type diffused thereover to form pinched base resistors.

* * * * *